United States Patent
Lai

(10) Patent No.: US 8,947,960 B2
(45) Date of Patent: Feb. 3, 2015

(54) SEMICONDUCTOR STORAGE WITH A FLOATING DETECTION CIRCUITRY AND FLOATING DETECTION METHOD THEREOF

(71) Applicant: Winbond Electronics Corp., Taichung (TW)

(72) Inventor: Chih-Jing Lai, New Taipei (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 13/857,680

(22) Filed: Apr. 5, 2013

(65) Prior Publication Data
US 2014/0301147 A1   Oct. 9, 2014

(51) Int. Cl.
G11C 29/00       (2006.01)
G11C 16/34       (2006.01)
G11C 16/04       (2006.01)

(52) U.S. Cl.
CPC ............ *G11C 16/34* (2013.01); *G11C 16/0408* (2013.01)
USPC ........... 365/201; 365/200; 365/203; 365/198; 365/191; 365/189.05

(58) Field of Classification Search
USPC ............ 365/198, 191, 189.05, 200, 201, 203
See application file for complete search history.

(56) References Cited

U.S. PATENT DOCUMENTS

| | | | |
|---|---|---|---|
| 5,748,545 A | 5/1998 | Lee et al. | |
| 7,440,347 B1 * | 10/2008 | Vogelsang | 365/201 |
| 7,636,267 B2 * | 12/2009 | Okada | 365/205 |
| 8,149,638 B2 * | 4/2012 | Kurosawa et al. | 365/201 |

* cited by examiner

*Primary Examiner* — Andrew Q Tran
(74) *Attorney, Agent, or Firm* — Muncy, Geissler, Olds & Lowe, P.C.

(57) ABSTRACT

A storage medium including a plurality of memory cells, a plurality of transmission lines, a driving module and a floating detection module is disclosed. The memory cells store data. The transmission lines are coupled to the memory cells. The driving module accesses the memory cells via the transmission lines. The floating detection module includes a reset unit, a plurality of connectors and a detector. The reset unit is coupled to a detection line. Each of the connectors is coupled between one of the transmission lines and the detection line. The detector determines whether a state of at least one of the transmission lines is a floating state according to a level of the detection line.

15 Claims, 10 Drawing Sheets

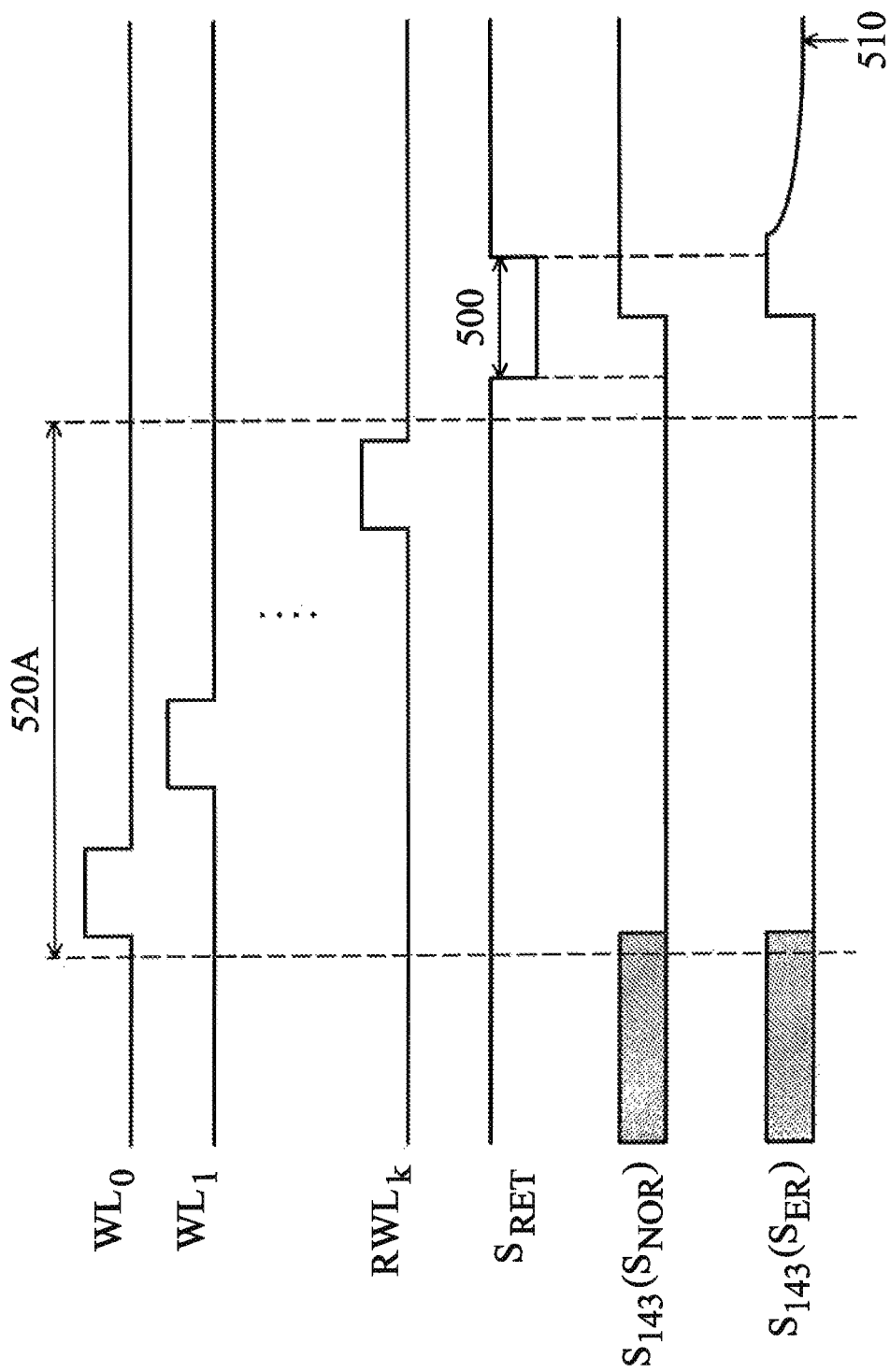

SEMICONDUCTOR STORAGE WITH A FLOATING DETECTION CIRCUITRY AND FLOATING DETECTION METHOD THEREOF

BACKGROUND OF THE INVENTION

1. Field of the Invention

The invention relates to a storage medium, and more particularly to a storage medium determining whether a state of a transmission line is a floating state.

2. Description of the Related Art

Generally, storage mediums comprise volatile memories and non-volatile memories. A volatile memory is memory wherein data stored thereto is erased when power provided to the memory is interrupted. On the contrary, non-volatile memory is memory wherein data stored thereto is not erased when power provided to the memory is interrupted. Thus, non-volatile memories are widely used in various mobile digital devices.

Each of the volatile memory and the non-volatile memory comprises a plurality of transmission lines, such as word lines and bit lines. Each of the plurality of transmission lines is utilized to access the corresponding memory cell. However, when one transmission line is abnormal, the plurality of memory cells coupled to the abnormal transmission line cannot be accessed. In one case, the abnormal transmission line may be opened. A conventional method utilizes a redundancy transmission line to replace the abnormal transmission line. The redundancy transmission line also comprises various redundancy memory cells to replace the corresponding memory cells coupled to the abnormal transmission line.

Although the redundancy transmission line replaces the corresponding memory cells coupled to the abnormal transmission line, the corresponding memory cells coupled to the abnormal transmission line have charges. The charges in the corresponding memory cells become a noise source to affect the charges in neighboring memory cells or all memory cells. Thus, the storage medium cannot be accessed normally.

BRIEF SUMMARY OF THE INVENTION

An exemplary embodiment of a storage medium comprises a plurality of memory cells, a plurality of transmission lines, a driving module and a floating detection module. The memory cells store data. The transmission lines are coupled to the memory cells. The driving module accesses the memory cells via the transmission lines. The floating detection module comprises a reset unit, a plurality of connectors and a detector. The reset unit is coupled to a detection line. Each of the connectors is coupled between one of the transmission lines and the detection line. The detector determines whether a state of at least one of the transmission lines is a floating state according to a level of the detection line.

An exemplary embodiment of a floating detection method for a storage medium is described in the following. The storage medium comprises a plurality of memory cells, a plurality of transmission lines, a driving module and a floating detection module. The driving module accesses the memory cells via the transmission lines. The transmission lines are coupled to a detection line via a plurality of connectors. A level of the detection line is set. It is determined whether the level of the detection line matches a pre-determined value. When the level of the detection line does not match the pre-determined value, it is determined that a state of at least one of the transmission lines is a floating state.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein:

FIGS. 3A, 3B, 4, 5A, and 5B are schematic diagrams of exemplary embodiments of a determining method of the floating detection module;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
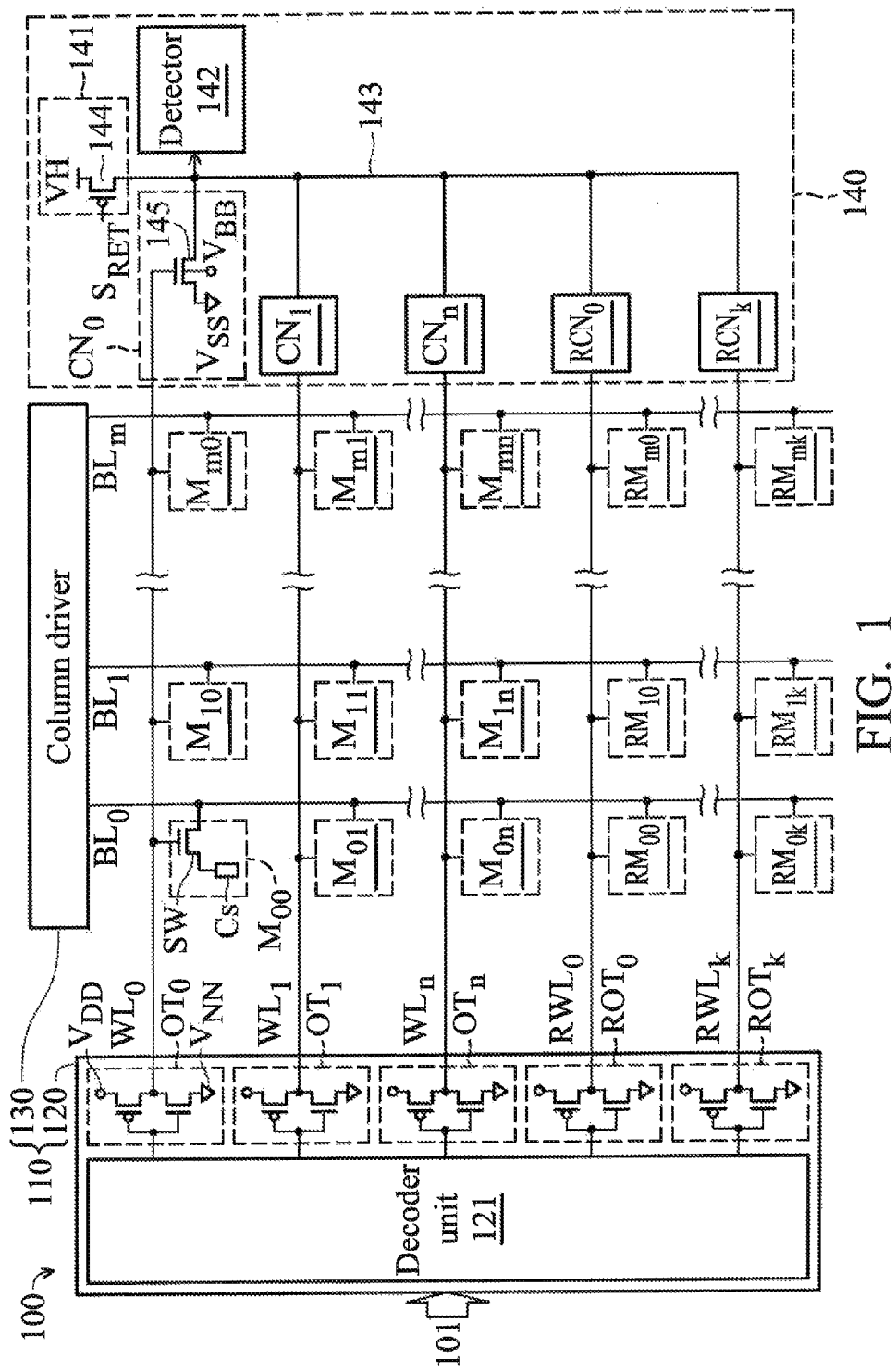
FIG. 1 is a schematic diagram of an exemplary embodiment of a storage medium.

FIG. 1 is a schematic diagram of an exemplary embodiment of a storage medium. The storage medium 100 comprises a driving module 110, transmission lines $WL_0 \sim WL_n$, $RWL_0 \sim RWL_k$, $BL_0 \sim BL_m$, memory cells $M_{00} \sim M_{mm}$ $RM_{00} \sim RM_{mk}$ and a floating detection module 140. In this embodiment, each of the transmission lines $RWL_0 \sim RWL_k$ is a redundancy transmission line to replace an abnormal transmission line among the transmission lines $WL_0 \sim WL_n$.

For example, when a testing engineer determines that the transmission line $WL_0$ is an abnormal line, the tester utilizes the transmission line $RWL_0$ to replace the transmission line $WL_0$, wherein the memory cells $RM_{00} \sim RM_0$ coupled to the transmission line $RWL_0$ replace the memory cells $M_{00} \sim M_{m0}$ coupled to the transmission line $WL_0$.

The driving module 110 accesses the memory cells $M_{00} \sim M_{mm}$ and $RM_{00} \sim RM_{mk}$ via the transmission lines $WL_0 \sim WL_n$, $RWL_0 \sim RWL_k$ and $BL_0 \sim BL_m$. In this embodiment, the driving module 110 comprises a row driver 120 and a column driver 130. The row driver 120 is provided to trigger the transmission lines $WL_0 \sim WL_n$ and $RWL_0 \sim RWL_k$. In this embodiment, the transmission lines $WL_0 \sim WL_n$ are word lines and the transmission lines $RWL_0 \sim RWL_k$ are redundancy word lines The invention does not limit the circuit structure of the row driver 120. In one embodiment, the row driver 120 comprises a decoder unit 121 and output stages $OT_0 \sim OT_n$, $ROT_0 \sim ROT_k$. The decoder unit 121 decodes an address signal 101 and controls the output stages $OT_0 \sim OT_n$ and $ROT_0 \sim ROT_k$ according to the decoded result for triggering transmission lines $WL_0 \sim WL_n$ and $RWL_0 \sim RWL_k$. In other words, the decoder unit 121 controls the states of the transmission lines $WL_0 \sim WL_n$ and $RWL_0 \sim RWL_k$.

In this embodiment, each of the output stages $OT_0 \sim OT_n$ and $ROT_0 \sim ROT_k$ comprises a P-type transistor and an N-type transistor, but the disclosure is not limited thereto. Taking the output stage $OT_0$ as an example, the P-type transistor is coupled to the N-type transistor in series between operation voltages $V_{DD}$ and $V_{NN}$. In one embodiment, the operation voltage $V_{DD}$ is higher than the operation voltage $V_{NN}$. The operation voltage $V_{NN}$ may be a negative value.

Figure 2:
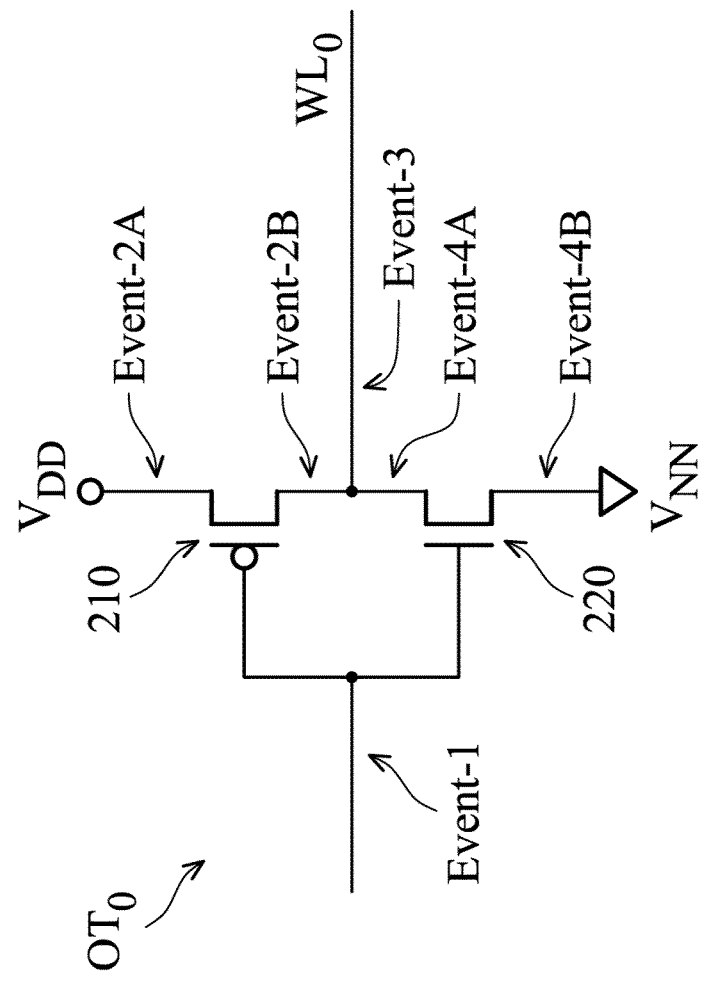
FIG. 2 is a schematic diagram showing various events causing an abnormal transmission line.

FIG. 2 is a schematic diagram showing various events causing an abnormal transmission line. The event-1 represents that an open issue has occurred between the gates of the P-type transistor 210 and the N-type transistor 220. The event-2A represents that an open issue has occurred in the source of the P-type transistor 210. The event-2B represents that an open issue has occurred in the drain of the P-type transistor 210. The event-3 represents that an open issue has occurred in the transmission line $WL_0$. The event-4A represents that an open issue has occurred in the drain of the N-type transistor 220. The event-4B represents that an open issue has occurred in the source of the N-type transistor 220. When one of the event-1 to event-4B occurs, the row driver 120 cannot normally control the state of the transmission line $WL_0$. Thus, the state of the transmission line $WL_0$ is a floating state.

With reference to FIG. 1, the column driver 130 retrieves the data stored in the memory cells $M_{00} \sim M_{mn}$ and $RM_{00} \sim RM_{mk}$ via the transmission lines $BL_0 \sim BL_m$ or writes data into the memory cells $M_{00} \sim M_{mn}$ and $RM_{00} \sim RM_{mk}$. In one embodiment, the column driver 130 is a sense amplifier to retrieve and amplify the data stored in the corresponding memory cell. In this embodiment, the transmission lines $BL_0 \sim BL_m$ are bit lines.

Each of the memory cells $M_{00} \sim M_{mn}$ and $RM_{00} \sim RM_{mk}$ comprises a switch SW and a storage capacitor Cs. When an unusual event occurs in one transmission line, the charge in the storage capacitor coupled to the unusual transmission line affects the data retrieved by the column driver 130. For example, if one of the event-1~event-4B occurs, the transmission line $WL_0$ is abnormal. When the transmission line $WL_0$ is abnormal, the row driver 120 cannot control the state of the transmission line $WL_0$ normally. Thus, a tester utilizes the transmission line $RWL_0$ to replace the transmission line $WL_0$. At this time, since the state of the transmission line $WL_0$ is a floating state, the charge stored in the memory cells $M_{00} \sim M_{m0}$ coupled to the transmission line $WL_0$ affects the charge stored in the memory cells $M_{00} \sim M_{m1}$ neighboring the memory cells $M_{00} \sim M_{m0}$ or the charge stored in other memory cells. Thus, the memory cells $M_{00} \sim M_{m0}$ coupled to the transmission line $WL_0$ become a noise source.

In this embodiment, the floating detection module 140 determines whether the state of at least one of the transmission lines $WL_0 \sim WL_n$ and $RWL_0 \sim RWL_k$ is a floating state. When the state of the at least one of the transmission lines $WL_0 \sim WL_n$ and $RWL_0 \sim RWL_k$ is the floating state, the storage medium is regarded as an abnormal product. Alternatively, when the state of each of the transmission lines $WL_0 \sim WL_n$ and $RWL_0 \sim RWL_k$ is not the floating state, the storage medium is regarded as a good product.

As shown in FIG. 1, the floating detection module 140 comprises a reset unit 141, connectors $CN_1 \sim CN_n$, $RCN_0 \sim RCN_k$ and a detector 142. The reset unit 141 is coupled to a detection line 143. The reset unit 141 sets the level of the detection line 143 during a reset period.

The invention does not limit the circuit structure of the reset unit 141. In this embodiment, the reset unit 141 is a P-type transistor 144. In one embodiment, the P-type transistor 144 is integrated in the column driver 130. As shown in FIG. 1, the P-type transistor 144 comprises a gate receiving a reset signal $S_{RET}$, a source receiving an operation voltage VH and a drain coupled to the detection line 143. In other embodiments, the reset unit 141 is an N-type transistor.

Each of the connectors $CN_0 \sim CN_n$ and $RCN_0 \sim RCN_k$ are coupled between one corresponding transmission line and the detection line 143. In this embodiment, the floating detection module 140 determines the states of the transmission lines $WL_0 \sim WL_n$ and $RWL_0 \sim RWL_k$. Thus, the connectors $CN_0 \sim CN_n$ and $RCN_0 \sim RCN_k$ are coupled to word lines (e.g. the transmission lines $WL_0 \sim WL_n$ and $RWL_0 \sim RWL_k$). The invention does not limit the kinds of the connectors $CN_0 \sim CN_n$ and $RCN_0 \sim RCN_k$. In one embodiment, the connectors $CN_0 \sim CN_n$ and $RCN_0 \sim RCN_k$ and the switches of the memory cells $M_{00} \sim RM_{mk}$ are N-type transistors.

Taking the connector $CN_0$ as an example, the N-type transistor 145 comprises a gate coupled to the transmission line $WL_0$, a drain coupled to the detection line 143, and a source receiving an operation voltage Vss. In this embodiment, the operation voltage Vss is less than the operation voltage VH. In one embodiment, the operation voltage Vss is a ground or less than a ground. In another embodiment, the operation voltage Vss is higher than the operation voltage $V_{NN}$. In other embodiments, the base of the N-type transistor 145 receives a base voltage $V_{BB}$. In one embodiment, the operation voltage Vss is equal to the base voltage $V_{BB}$.

Figure 3A:
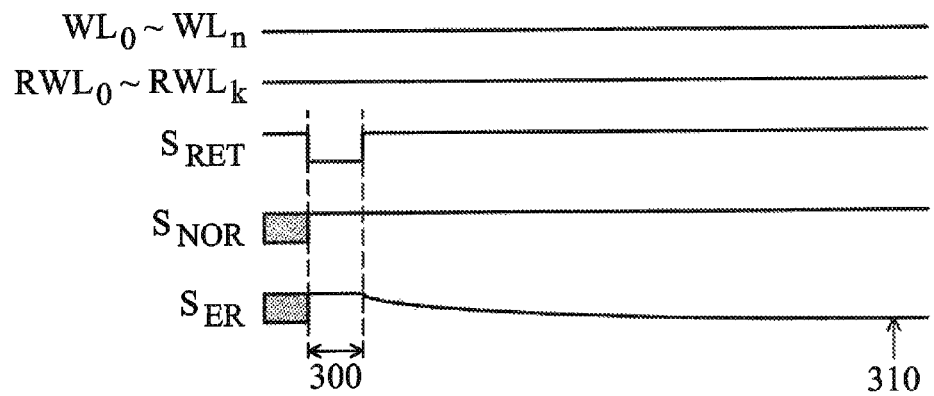

The detector 142 determines whether the state of at least one of the transmission lines $WL_0 \sim RWL_k$ is a floating state according to the level of the detection line 143. FIG. 3A is a schematic diagram of an exemplary embodiment of a determining method of the floating detection module 140. First, the row driver 120 does not trigger the transmission lines $WL_0 \sim RWL_k$. Thus, the state of each of the transmission lines $WL_0 \sim WL_m$ and $RWL_0 \sim RWL_k$ is a low level state.

During a reset period 300, the reset signal $S_{RET}$ is at a low level. Thus, the P-type transistor 144 is turned on such that the level of the detection line 143 is a high level. When the reset signal $S_{RET}$ is changed from the low level to a high level, the level of the detection line 143 matches a pre-determined level. For example, the level of the detection line 143 should be fixed at a high level (indicated by $S_{NOR}$). However, the level of the detection line 143 does not match the pre-determined level when the states of at least one of the transmission lines $WL_0 \sim WL_m$ and $RWL_0$-$RWL_k$ is abnormal. In one embodiment, the level of the detection line 143 is changed to the low level (indicated by $S_{ER}$).

Thus, the detector 142 determines the level of the detection line 143 during a detection period 310. When the level of the detection line 143 does not match a pre-determined level (indicated by $S_{ER}$), the detector 142 determines that the state of at least one of the transmission lines $WL_0 \sim WL_m$ and $RWL_0 \sim RWL_k$ is a floating state. In one embodiment, the event-1, the event-3, the event-4A or the event-4B induces the floating state.

Figure 3B:
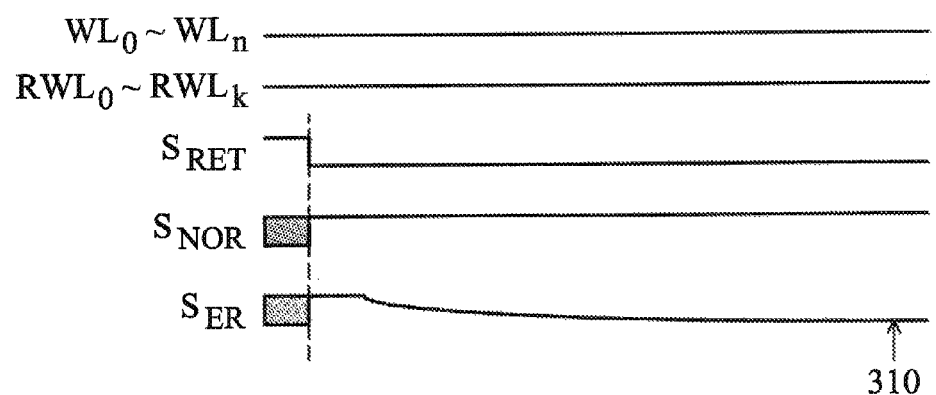

FIG. 3B is a schematic diagram of another exemplary embodiment of the determining method. When the level of the reset signal $S_{RET}$ is changed from the high level to the low level, the level of the detection line 143 is set to the high level. After setting the level of the detection line 143, the reset signal $S_{RET}$ is still maintained at the low level. In this case, although the P-type transistor 144 is still turned on, the level of the detection line 143 is not fixed at the high level when the state of at least one of the transmission lines $WL_0 \sim WL_m$ and $RWL_0 \sim RWL_k$ is the floating state. During the detection period 320, the level of the detection line 143 is gradually reduced (indicated by $S_{ER}$).

Figure 4:
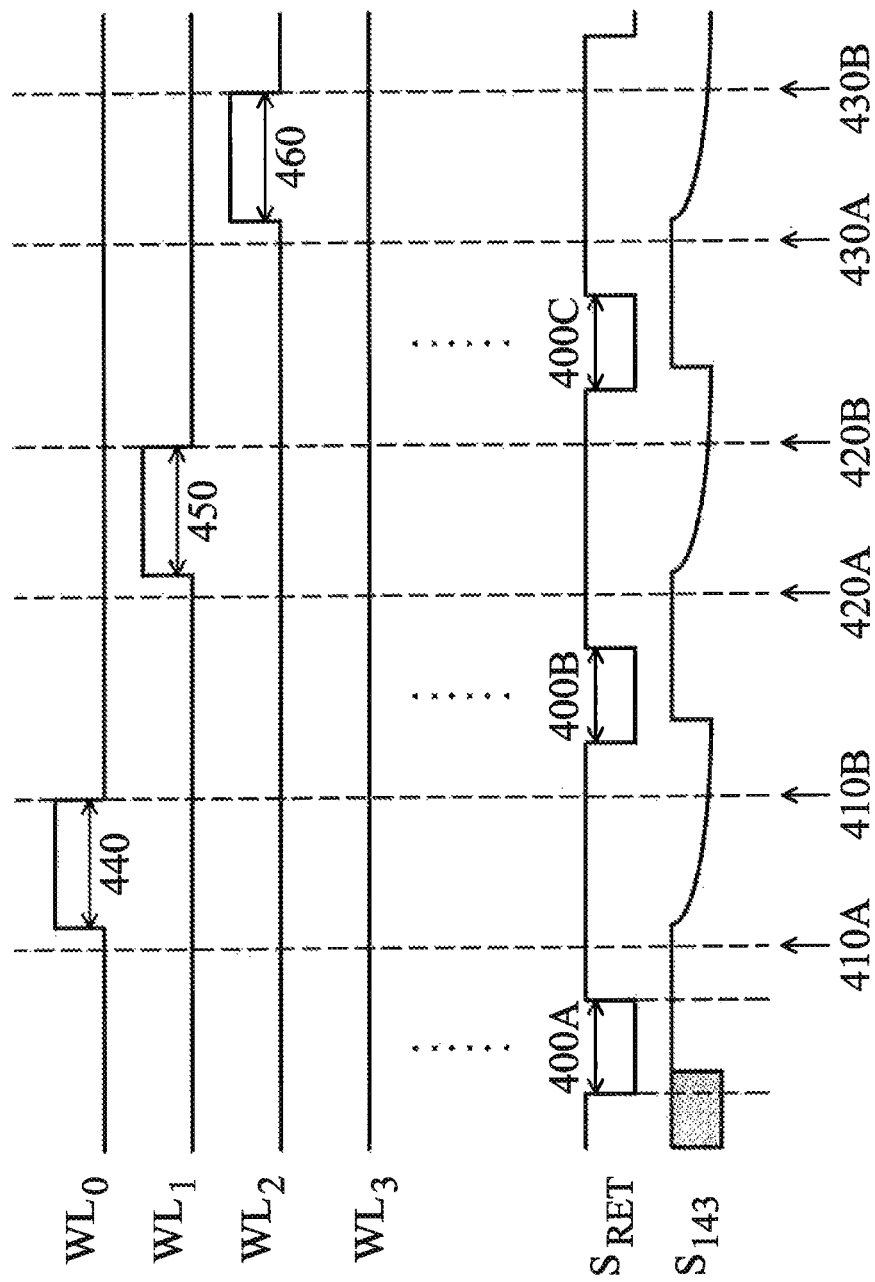

FIG. 4 is a schematic diagram of another exemplary embodiment of the determining method. During the reset period 400A, the reset signal $S_{RET}$ is at a low level. Thus, the P-type transistor 144 is turned such that the level $S_{143}$ of the detection line 143 is a high level. After the reset period 400A, the reset signal $S_{RET}$ is at a high level. Thus, the P-type transistor 144 is turned off. At this time, the level $S_{143}$ of the detection line 143 should match a pre-determined level, such as the high level.

During a triggering period 440, the row driver 120 triggers the transmission line $WL_0$. At this time, the connector $CN_0$ is turned on. Thus, the level $S_{143}$ of the detection line 143 is gradually reduced. Then, the P-type transistor 144 is turned on during a reset period 400B. Thus, the level $S_{143}$ of the detection line 143 is increased to match a pre-determined level, such as a high level. Then, the row driver 120 triggers the transmission line $WL_1$ during a triggering period 450. At this time, the connector $CN_1$ is turned on. Thus, the level $S_{143}$ of the detection line 143 is gradually reduced again.

The detector 142 determines Whether the state of at least one of the transmission lines $WL_0$~$RWL_k$ is a floating state according to the level $S_{143}$ of the detection line 143. In one embodiment, the detector 142 determines the level $S_{143}$ of the detection line 143 during the detection period 410A. When the level $S_{143}$ of the detection line 143 does not match a pre-determined level, it represents that the state of at least one of the transmission lines $WL_0$~$RWL_k$ is the floating state caused by the event-1, the event-3, the event-4A or the event-4B. Then, the detector 142 determines the level $S_{143}$ of the detection line 143 during the detection period 410B. When the level $S_{143}$ of the detection line 143 matches the pre-determined level, it represents that the event-2A or the event-2B has occurred such that the level $S_{143}$ of the detection line 143 is not reduced. Thus, the tester determines that the state of at least one of the transmission lines $WL_0$~$RWL_k$ is the floating state according to the determining result of the detector 142.

In this embodiment, the level $S_{143}$ of the detection line 143 matches a pre-determined level during the detection periods 410A, 420A and 430A. If the level $S_{143}$ of the detection line 143 does not match the pre-determined level during the detection periods 410A, 420A and 430A, it represents that the state of at least one of the transmission lines $WL_0$~$RWL_k$ is the floating state. In addition, the level $S_{143}$ of the detection line 143 does not match the pre-determined level during the detection periods 410B, 420B and 430B. If the level $S_{143}$ of the detection line 143 matches the pre-determined level during the detection periods 410B, 420B and 430B, it represents that the state of at least one of the transmission lines $WL_0$~$RWL_k$ is the floating state.

FIG. 5A is a schematic diagram of another exemplary embodiment of the determining method. FIG. 5A is similar to FIG. 3 except for the addition of a start period 520A. The start period 520A is before the reset period 500. During the start period 520A, the row driver 120 sequentially triggers the transmission lines $WL_0$~$RWL_k$. Thus, the level $S_{143}$ of the detection line 143 should be a low level (indicated by $S_{NOR}$).

During the reset period 500, the level of the reset signal $S_{RET}$ is a low level such that the level $S_{143}$ of the detection line 143 is a high level. When the level of the reset signal $S_{RET}$ is changed from the low level to a high level, the level $S_{143}$ of the detection line 143 should be maintained at the high level (indicated by $S_{NOR}$). Thus, the detector 142 determines whether the state of at least one of the transmission lines $WL_0$~$RWL_k$ is a floating state according to the level $S_{143}$ of the detection line 143 during the detection period 510. However, when the level $S_{143}$ of the detection line 143 is not maintained at the high level (indicated by $S_{ER}$), it represents that the state of at least one of the transmission lines $WL_0$~$RWL_k$ is the floating state.

Figure 5B:
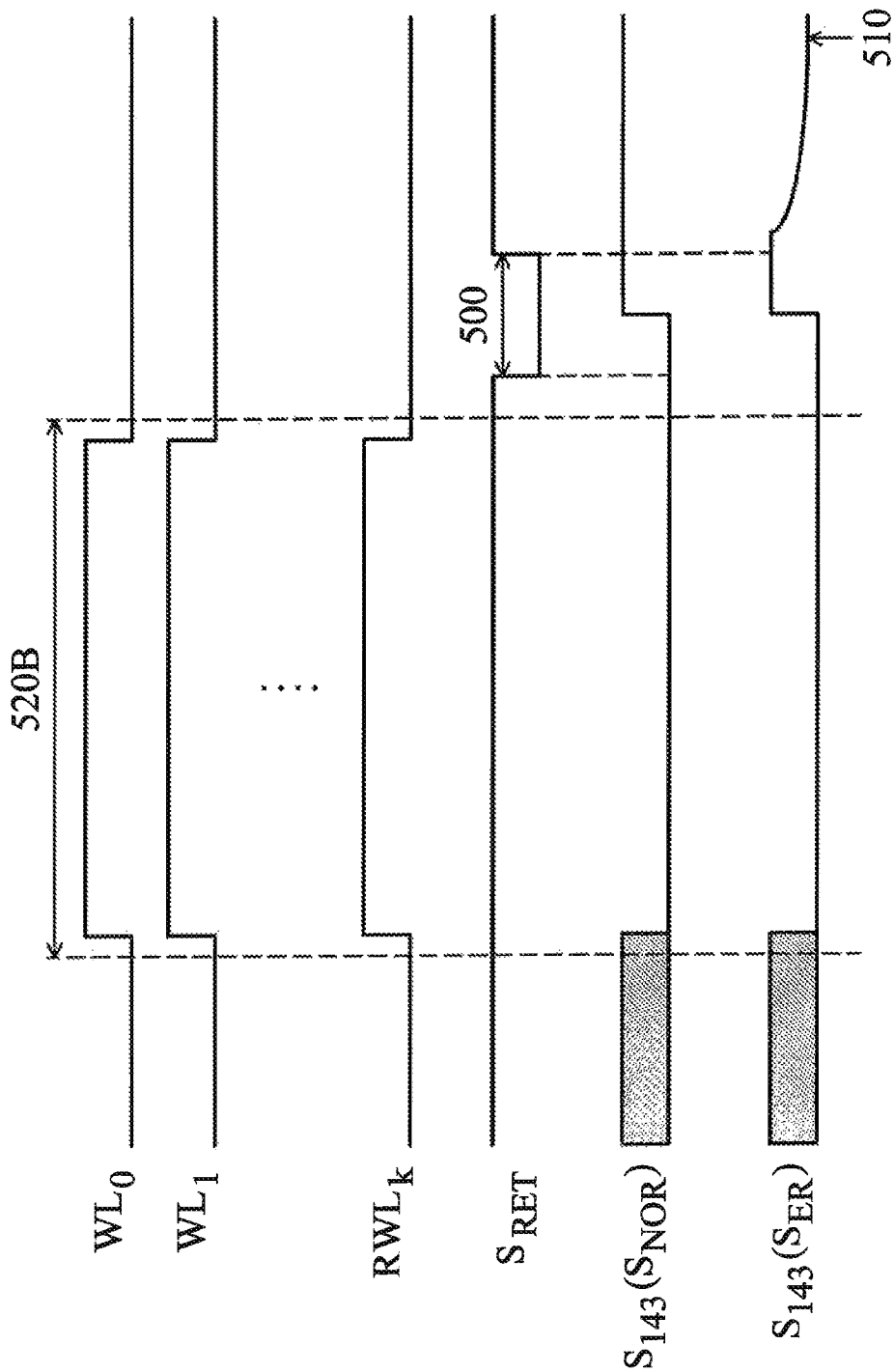

FIG. 5B is a schematic diagram of another exemplary embodiment of the determining method. FIG. 5B is similar to FIG. 5A with the exception that the row driver 120 simultaneously triggers the transmission lines $WL_0$~$RWL_k$ during the start period 520B. Since FIGS. 5A and 5B have the same principles, description of FIG. 5B is omitted for brevity.

Figure 6:
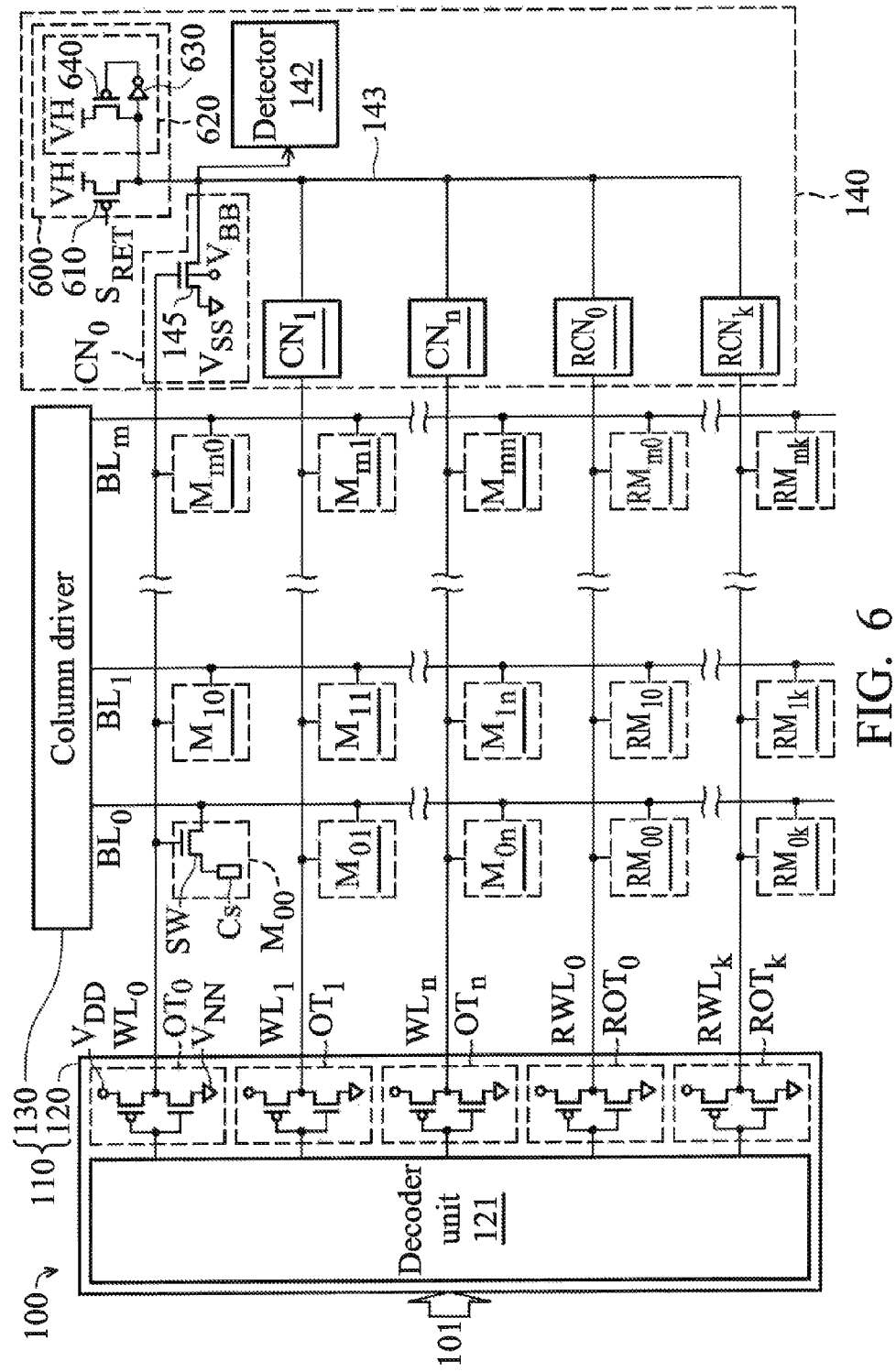
FIGS. 6 and 7 are schematic diagrams of exemplary embodiments of the storage medium.

FIG. 6 is a schematic diagram of an exemplary embodiment of the storage medium. FIG. 6 is similar to FIG. 1 with the exception that a reset unit 600 shown in FIG. 6 comprises a transistor 610 and a latch 620. In this embodiment, the transistor 610 is a P-type transistor, but the disclosure is not limited thereto. In other embodiments, the transistor 610 is an N-type transistor. As shown in FIG. 6, the transistor 610 comprises a gate receiving a reset signal $S_{RET}$, a source receiving an operation voltage VH and a drain coupled to the detection line 143.

The latch 620 latches the level of the detection line 143. In this embodiment, the latch 620 comprises an inverter 630 and a transistor 640. The inverter 630 comprises an input terminal coupled to the drain of the transistor 640 and an output terminal coupled to the gate of the transistor 640. The source of the transistor 640 receives the operation voltage VH. The drain of the transistor 640 is coupled to the detection line 143.

Figure 7:
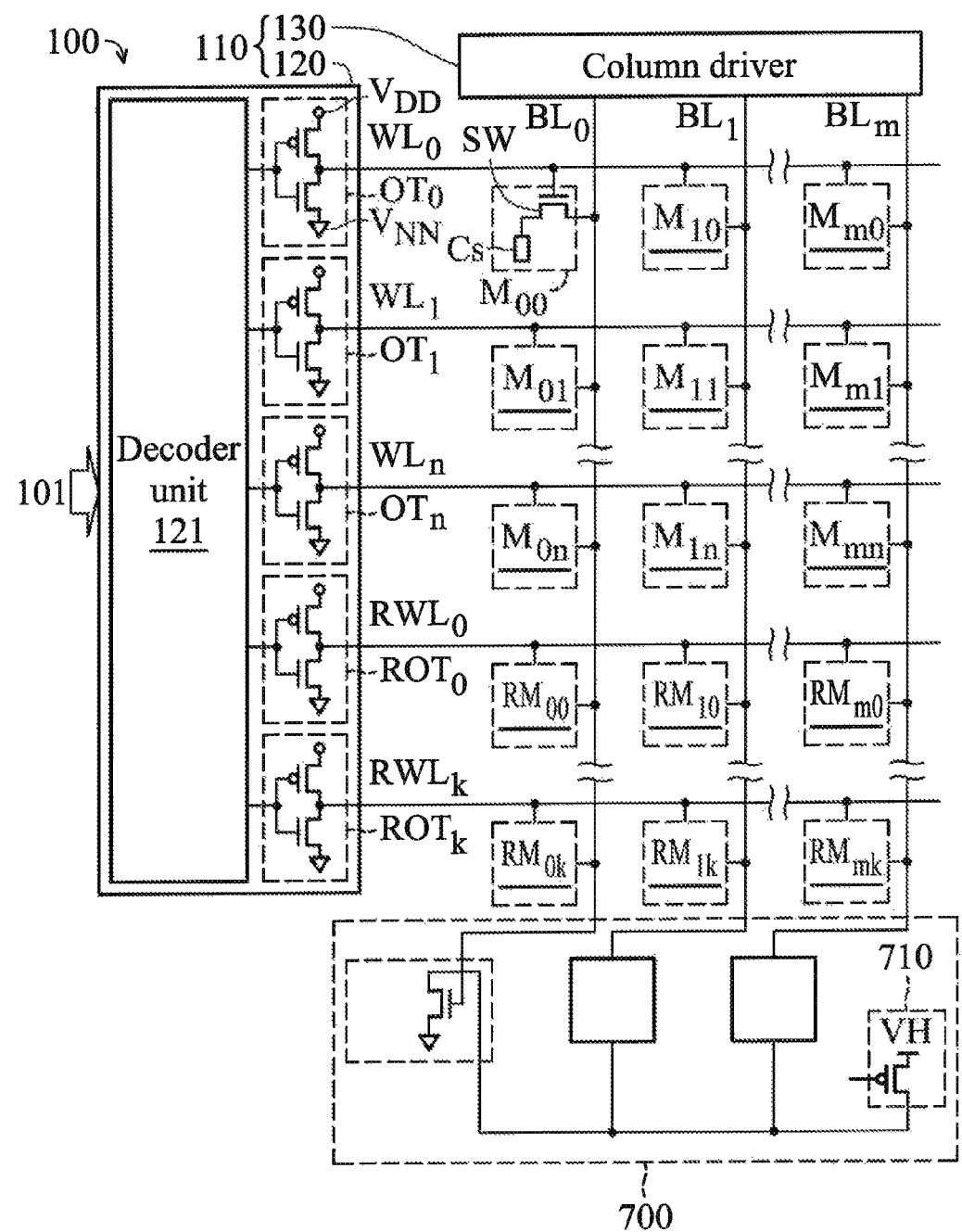

FIG. 7 is a schematic diagram of another exemplary embodiment of the storage medium. FIG. 7 is similar to FIG. 1 with the exception that the floating detection module 700 is coupled to the transmission lines $BL_0$~$BL_m$ and determines whether the state of at least one of the transmission lines $BL_0$~$BL_m$ is a floating state. Since FIGS. 1 and 7 have the same principle, description of FIG. 7 is omitted for brevity. In one embodiment, the reset unit 700 is replaced by the reset unit 600 shown in FIG. 6. In another embodiment, the floating detection module 700 is applied in FIG. 1. Thus, the storage medium comprises two floating detection modules to determine the states of the vertical transmission lines $BL_0$~$BL_m$ and the horizontal transmission lines and $RWL_0$~$RWL_k$, respectively.

Figure 8A:
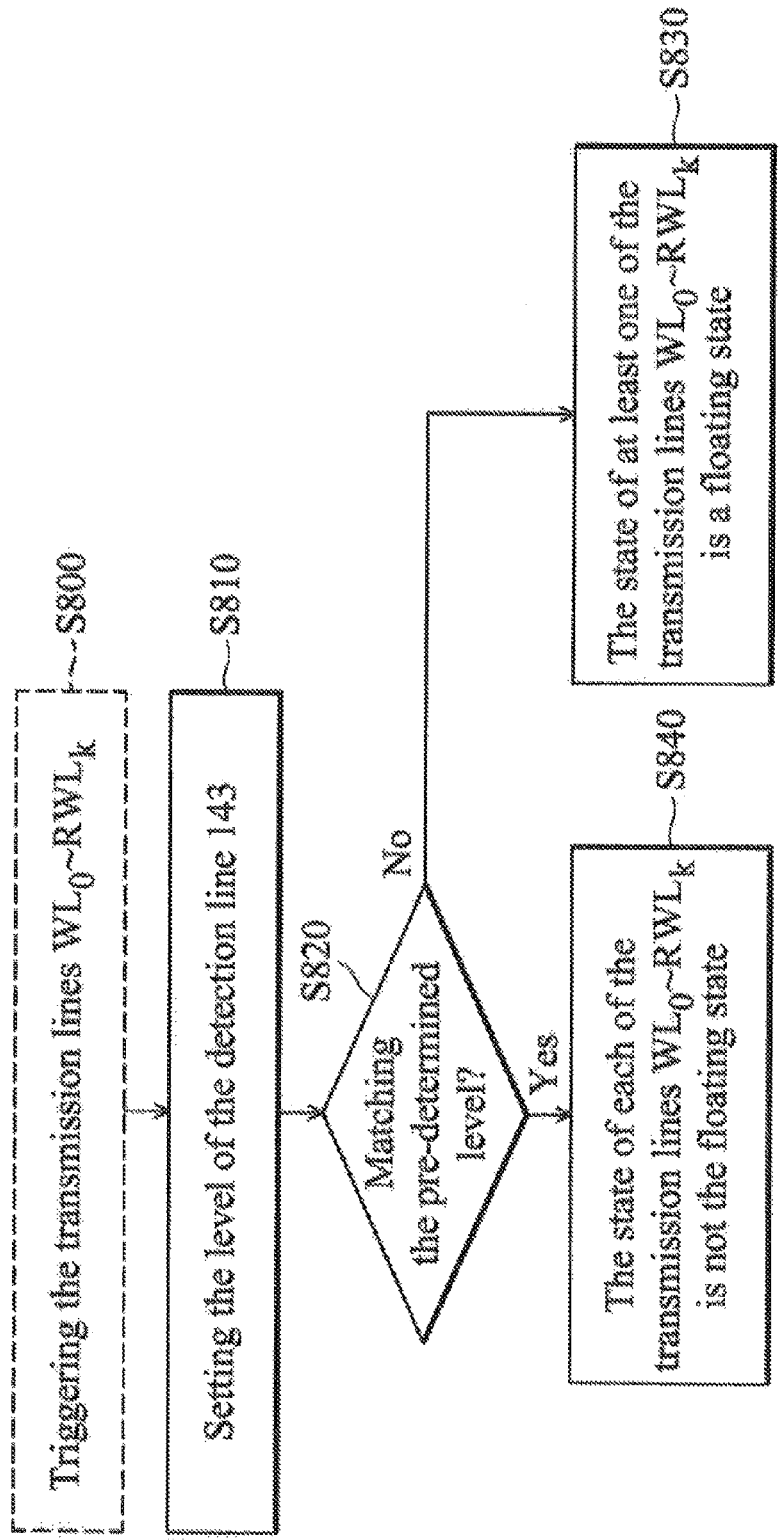
FIGS. 8A and 8B are flowcharts of exemplary embodiments of the determining method.

FIG. 8A is a flowchart of another exemplary embodiment of the determining method. The determining method shown in FIG. 8A can be applied to the storage mediums shown in FIGS. 1, 6 and 7. Taking FIG. 1 as an example, the transmission lines $WL_0$~$RWL_k$ are triggered (step S800). The invention does not limit the sequence for which the row driver 120 triggers the transmission lines $WL_0$~$RWL_k$. Additionally, step S800 may be optionally removed in other embodiments.

Then, the level of the detection line 143 is set (step S810). In one embodiment, a reset unit (e.g. 141) is utilized to set the level of the detection line 143. Next, it is determined whether the level of the detection line matches a pre-determined level (step S820).

When the level of the detection line 143 does not match the pre-determined level, it represents that the state of at least one of the transmission lines $WL_0$~$RWL_k$ is a floating state (step S830). Thus, the detection 142 outputs a first detection result. Contrarily, when the level of the detection line 143 matches the pre-determined level, it represents that the state of each of the transmission lines $WL_0$~$RWL_k$ is not the floating state (step S840). Thus, the detection 142 outputs a second detection result.

Figure 8B:
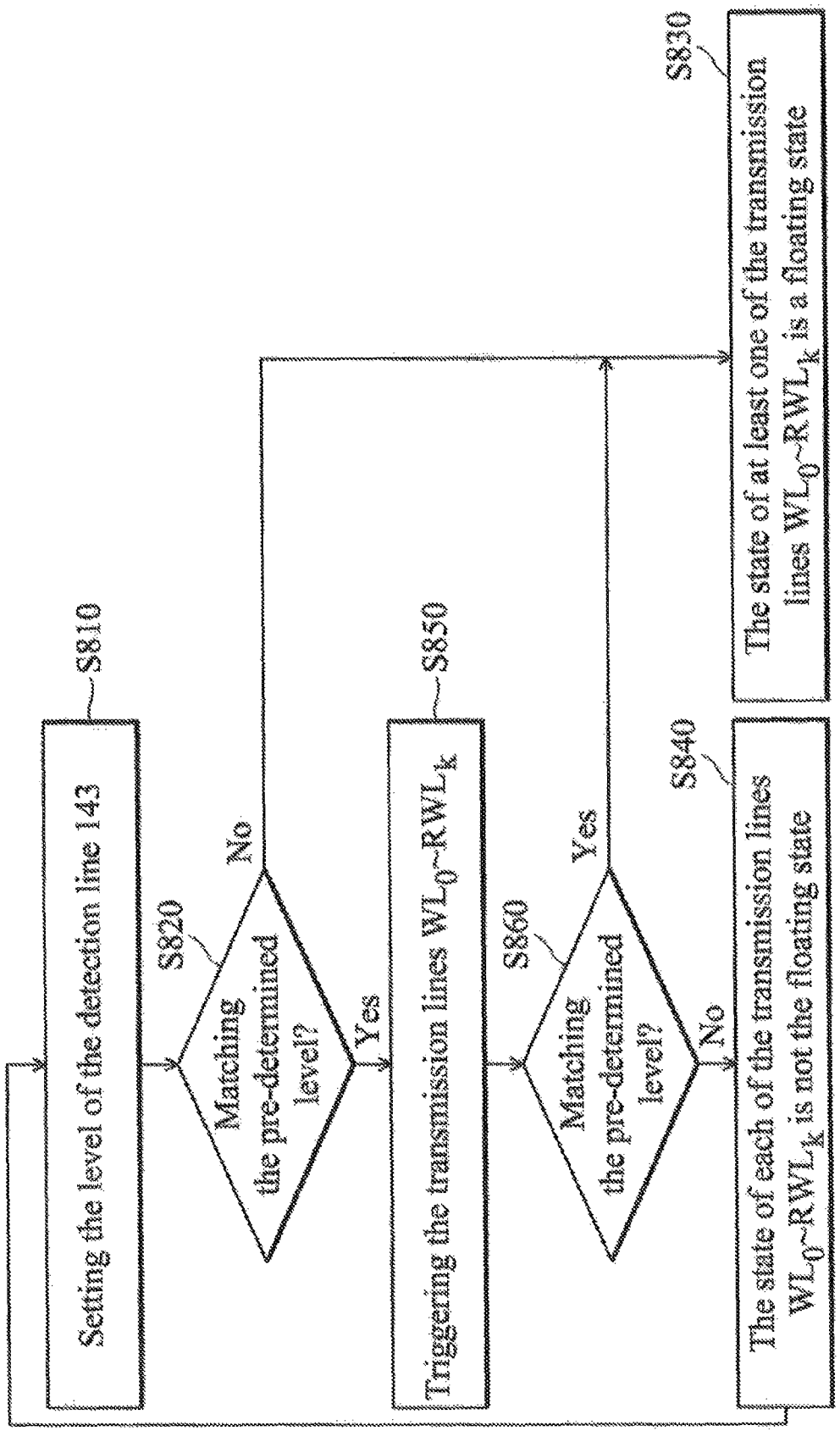

FIG. 8B is a flowchart of another exemplary embodiment of the determining method. FIG. 8B is similar to FIG. 8A with the exception that step S800 is omitted and steps S850 and S860 are added. When the level of the detection line 143 matches the pre-determined level, a first transmission line among the transmission lines $WL_0$~$RWL_k$ is triggered (step S850). Then, it is determined whether the level of the detection line 143 matches the pre-determined level (step S860).

When the level of the detection line 143 matches the pre-determined level, it represents that the state of at least one of the transmission lines $WL_0$~$RWL_k$ is a floating state (step S830). When the level of the detection line 143 does not match the pre-determined level, it represents that the state of each of the transmission lines $WL_0 \sim RWL_k$ is not the floating state (step S840). Thus, step S810 is executed to set the level of the detection line 143 again and determine Whether the level of the detection line 143 matches the pre-determined level (step S820).

When the level of the detection line 143 matches the pre-determined level, next transmission line is triggered (step S850) and then it is determined whether the level of the detection line 143 matches the pre-determined level (step S860). When the level of the detection line 143 does not match the pre-determined level, step S810 is executed and next transmission line is triggered after step S820 until all transmission lines are triggered.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A storage medium, comprising:
   a plurality of memory cells storing data;
   a plurality of transmission lines coupled to the memory cells;
   a driving module accessing the memory cells via the transmission lines; and
   a floating detection module comprising:
   a reset unit coupled to a detection line;
   a plurality of connectors, each coupled between one of the transmission lines and the detection line; and
   a detector determining whether at least one of the transmission lines is abnormal according to a level of the detection line during a first detection period, wherein the driving module does not trigger the transmission lines during the first detection period.

2. The storage medium as claimed in claim 1, wherein during a reset period, the reset unit sets the level of the detection line, during the first detection period, the detector determines the level of the detection line, and when the level of the detection line does not match a pre-determined level, the detector determines that the at least one of the transmission lines is abnormal.

3. The storage medium as claimed in claim 1, wherein the transmission lines comprise a plurality of word lines and a plurality of bit lines, and the connectors are coupled to the word lines respectively.

4. The storage medium as claimed in claim 3, wherein during a second detection period, the driving module triggers a first word line among the word lines and the detector determines the level of the detection line, and when the level of the detection line matches the pre-determined level, the detector determines that the first word line is abnormal.

5. The storage medium as claimed in claim 3, wherein during a start period before a reset period, the driving module triggers the word lines successively.

6. The storage medium as claimed in claim 3, wherein during a start period before a reset period, the driving module triggers the word lines simultaneously.

7. The storage medium as claimed in claim 3, wherein the reset unit is a transistor, and the transistor comprises a gate receiving a reset signal, a source receiving a first operation voltage and a drain coupled to the detection line.

8. The storage medium as claimed in claim 3, wherein the reset unit comprises:
   a first transistor comprising a gate receiving a reset signal, a source receiving a first operation voltage and a drain coupled to the detection line; and
   a latch latching the level of the detection line.

9. The storage medium as claimed in claim 8, wherein the latch comprises:
   a second transistor comprising a source receiving the first operation voltage and a drain coupled to the detection line; and
   an inverter comprising an input terminal coupled to the drain of the second transistor and an output terminal coupled to a gate of the second transistor.

10. The storage medium as claimed in claim 3, wherein each connector is a transistor comprising a gate coupled to one of the word lines, a drain coupled to the detection line and a source receiving a second operation voltage less than the first operation voltage.

11. The storage medium as claimed in claim 1, wherein when the reset unit does not set the level of the detection line and the level of the detection line does not match a pre-determined level, the detector determines that the at least one of the transmission lines is abnormal.

12. A floating detection method for a storage medium comprising a plurality of memory cells, a plurality of transmission lines, a driving module and a floating detection module, wherein the driving module accesses the memory cells via the transmission lines, and the transmission lines are coupled to a detection line via a plurality of connectors, comprising:
   setting a level of the detection line during a reset period; and
   determining whether the level of the detection line matches a pre-determined level during a detection period, wherein when the level of the detection line does not match the pre-determined level, it is determined that at least one of the transmission lines is abnormal, wherein the driving module does not trigger the transmission lines during the detection period.

13. The floating detection method as claimed in claim 12, further comprising:
   triggering a first transmission line among the transmission lines during a start period before the detection period; and
   determining whether the level of the detection line matches the pre-determined level during the detection period, wherein when the level of the detection line matches the pre-determined level, it is determined that the first transmission line is abnormal.

14. The floating detection method as claimed in claim 12, further comprising:
   successively triggering the transmission lines before the reset period.

15. The floating detection method as claimed in claim 12, further comprising:
   simultaneously triggering the transmission lines before the reset period.

* * * * *